United States Patent [19]

Dietrich et al.

[11] Patent Number: 5,024,966

[45] Date of Patent: Jun. 18, 1991

[54] METHOD OF FORMING A SILICON-BASED SEMICONDUCTOR OPTICAL DEVICE MOUNT

[75] Inventors: Norman R. Dietrich, Allentown; Ralph S. Moyer, Cumru Township, Berks County, both of Pa.; Yiu-Huen Wong, Summit, N.J.

[73] Assignee: AT&T Bell Laboratories, Murray Hill, N.J.

[21] Appl. No.: 510,338

[22] Filed: Apr. 16, 1990

Related U.S. Application Data

[62] Division of Ser. No. 287,778, Dec. 21, 1988, Pat. No. 4,937,660.

[51] Int. Cl.$^5$ .......................................... H01L 21/00
[52] U.S. Cl. ..................................... 437/60; 437/206; 437/180; 437/2; 437/3; 437/905; 437/906; 148/DIG. 99; 148/DIG. 168
[58] Field of Search .................. 437/60, 906, 206, 209, 437/220, 180, 221, 66, 2, 3, 905; 148/DIG. 99, DIG. 168

[56] References Cited

U.S. PATENT DOCUMENTS

| | | | |
|---|---|---|---|
| 3,343,256 | 9/1967 | Smith et al. | 437/180 |
| 3,757,259 | 9/1973 | Jones et al. | 333/84 M |
| 4,035,748 | 7/1977 | Kusaka et al. | 333/33 |
| 4,097,891 | 7/1978 | Selway et al. | 357/81 |
| 4,301,429 | 11/1981 | Goldman et al. | 333/22 R |
| 4,379,273 | 4/1983 | Bender | 333/32 |
| 4,418,466 | 12/1983 | Piedmont et al. | 437/906 |
| 4,485,361 | 11/1984 | Bender | 333/32 |

Primary Examiner—Brian E. Hearn
Assistant Examiner—Tuan Nguyen
Attorney, Agent, or Firm—Wendy W. Koba

[57] ABSTRACT

A silicon-based laser mounting structure is disclosed which provides improved interconnection between a semiconductor optical device, such as a laser, and an external high frequency modulation current source, by reducing the presence of parasitic inductive elements in the interconnecting network. The structure includes a stripline transmission path formed by depositing metal conductive strips on the top and bottom surfaces of a silicon substrate. The conductive strips are coupled at one end to the external modulation current source. A thin film resistor is deposited between the second end of the top conductive strip and the semiconductor optical device. This thin film resistor is utilized to provide impedance matching between the optical device and the stripline. That is, for a laser with an impedance $Z_L$, and a stripline designed to have an impedance $Z_S$, the resistance R is chosen such that $R+Z_L=Z_S$. Utilizing silicon processing techniques, the thin film resistor may be placed adjacent to the laser, reducing the parasitics associated with their interconnection. A conductive via is formed through the substrate to provide a top-side bonding location for connecting the optical device to the bottom metal conductor by providing the top-side site, the parasitic inductance associated with this interconnection is considerably reduced.

7 Claims, 3 Drawing Sheets

METHOD OF FORMING A SILICON-BASED SEMICONDUCTOR OPTICAL DEVICE MOUNT

This is a division of application Ser. No. 287,778 filed Dec. 21, 1988, now U.S. Pat. No. 4,937,660.

BACKGROUND OF THE INVENTION

1. Technical Field

The present invention relates to a semiconductor optical device mounting structure and, more particularly, to a silicon-based stripline structure for providing an interconnection between the semiconductor optical device and a high frequency modulation current source.

2. Description of the Prior Art

Semiconductor optical devices, such as lasers and light emitting diodes (LEDs), are used in a wide variety of applications, due to their compactness, relatively high efficiency, and well-controlled output. However, a number of requirements are imposed upon these devices. For durability, cooling of the optical device is necessary, since prolonged high temperature operation can seriously damage and even destroy the device. Further, since the output light intensity from the device is a function of its junction temperature, the supporting structure must be able to dissipate the tremendous amount of heat generated by the high current density in the device in its operating state.

While it is relatively simple to solve these temperature related problems (by use of a thermo-electric cooler, for example), other problems develop when a semiconductor optical device is operated at extremely high bit rates, for example, above 1 Gb/s. At these speeds, the low impedance of the laser relative to that of the modulation current source, as well as the parasitics associated with the interconnecting network, become critical factors. Minimizing these parasitics by matching the network impedance to the optical device impedance over a broad bandwidth must be performed in order to achieve acceptable performance. It is well-known that semiconductor devices such as lasers exhibit an impedance in the range of 2–8Ω, while most high frequency modulation current sources have a relatively high output impedance ($>>50\Omega$, typically). The impedance mismatch between the laser and the modulation current source would cause multiple reflections of the signal from the laser and consequently severe distortion in the signal waveform applied to the laser. This distortion, in turn, degrades the bit error rate (BER) of the system incorporating the laser. One approach to this problem is disclosed in U.S. Pat. No. 4,097,891 issued to P. R. Selway et al. on June 27, 1978. Selway et al. disclose a particular laser stud mount design which utilizes a stripline (a conductive strip held between a pair of ceramic annuli) as one terminal connection for the laser. The stripline may then be correctly sized (in terms of thickness and width) to provide impedance matching between the signal source and the laser.

A problem with this approach is that since every laser exhibits a slightly different impedance (related to processing variations), each stripline of the Selway et al. design would have to be individually designed to match the particular laser to which it is being coupled. Further, in trying to use the stripline to directly match the impedance of the laser to the modulation current source, other problems develop. In general, to provide impedance matching, the ideal solution is either to decrease the impedance looking back from the laser to the source (so that the source appears to the laser as an equivalent load) or, alternatively, to increase the resistance of the laser as seen by the supply. For many reasons, however, these alternatives are impractical, if not impossible. In particular, to decrease the source impedance as seen by the laser would require the use of an extremely thin stripline, making the device too fragile for practical applications. In contrast, providing a stripline which increases the laser's impedance would greatly increase the necessary voltage swing of the modulation current source required to deliver the same current to the laser. Additionally, these arrangements, by nature of their design, introduce parasitic inductive elements into the interconnection network. At high bit rates, greater than 1 Gb/s, for example, these parasitics seriously load the signal applied to the laser and severely degrade the performance of the system.

Thus, a need remains in the prior art for a means of interconnecting a semiconductor optical device to a high frequency modulation current current source which allows the laser to operate at high bit rates, e.g., speeds exceeding 1 Gb/s without introducing excessive parasitic inductive elements into the interconnecting network.

SUMMARY OF THE INVENTION

The need remaining in the prior art is addressed by the present invention which relates to a mounting structure for semiconductor optical devices and, more particularly, to a silicon-based stripline structure for providing an interconnection with improved impedance matching between the optical device and a high frequency modulation current source.

It is an aspect of the present invention to provide a stripline interconnection with reduced parasitic elements comprising a silicon substrate as the dielectric, with the top and bottom surfaces of the silicon metallized to form the signal and ground conductors of the stripline. The thickness of the silicon substrate and the width of the signal conductor are chosen to provide a stripline having the desired characteristic impedance, as will be described in detail below. A deposited resistance feature, such as a thin film deposit, is formed on the silicon surface adjacent to the laser, where the value of the resistance feature is chosen such that the combination of this resistance R with the impedance $Z_L$ of the laser will essentially match the characteristic impedance $Z_s$ of the stripline ($R + Z_L = Z_s$). The value of the deposited thin film resistor may be individually tailored such that matching will be provided, regardless of the laser's specific resistance. By forming the resistor adjacent to the laser, the value of the parasitic inductor associated with the spacing between these two elements will be significantly reduced.

An advantage of the present invention is that the interconnection is silicon-based, allowing well-known silicon processing techniques to be used in the formation of the laser/modulation source interconnection. In particular, a metallized via is formed through the silicon substrate to facilitate the interconnection of the bottom conductor of the stripline to the top side of the laser chip. The use of the via technique has been found to significantly shorten this interconnection (otherwise formed by means of a number of wirebonds). The length of these wirebond interconnections increases the parasitic inductance of the interconnection and therefore becomes a serious concern at high bit rates. Shortening these interconnection paths in accordance with the invention decreases the parasitic elements mentioned above, thus providing improved performance of the mounted laser, in terms of bandwidth. Additionally, the silicon fabrication techniques allow for the impedance matching resistor to be formed adjacent to the laser. This close placement thus reduces parasitics by reducing the spacing between the resistor and the laser. Further, the silicon-based stripline mounts may be produced in mass quantities, with thousands being included on a single wafer. This volume represents orders of magnitude increase in fabrication efficiency over previous arrangements which used ceramics or other materials and required individual fabrication. The commensurate savings in expense is obvious.

Other and further advantages of the present invention will become apparent during the course of the following discussion and by reference to the accompanying drawings.

Brief Description of the Drawing

Referring now to the drawings, where like numerals represent like parts in several views.

DETAILED DESCRIPTION

Figure 1:
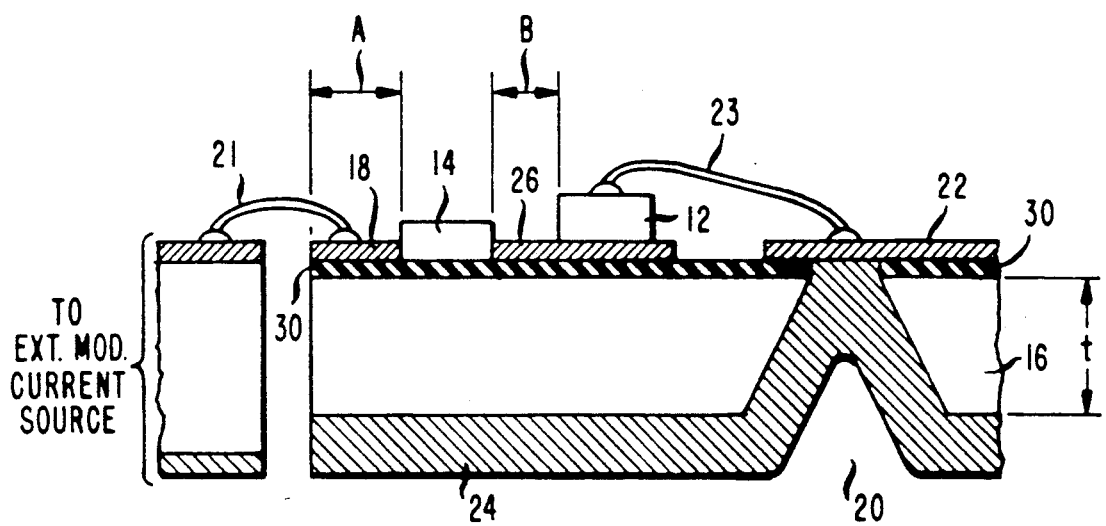
FIG. 1 illustrates an exemplary silicon-based stripline mount formed in accordance with the present invention.

A silicon-based stripline mount 10 of the present invention for providing an interconnection between a semiconductor optical device and a high frequency modulation current source is illustrated in FIG. 1. As shown, an exemplary semiconductor optical device, such as a laser 12 and impedance matching resistor 14 are located on the top surface 17 of a silicon substrate 16. It is to be noted that although the following describes a mount for a semiconductor laser, a similar mount formed in accordance with the present invention may be utilized with other semiconductor optical devices, such as edge-emitting LEDs. As will be described in detail hereinafter, the thickness t of substrate 16 is chosen to provide the desired characteristic impedance $Z_s$ of the transmission line. First and second condutors 18 and 24 provide, in conjunction with substrate 16, a first transmission line section A from the edge of mount 10 to resistor 14, where conductors 18 and 24 are coupled to separate terminal connections of the external modulation current source (not shown). The width w of first conductor 18 is also a factor in determining the impedance $Z_s$ of the stripline. It is to be noted that the terms "stripline" and "transmission line" are being used interchangeably, where it is to be understood that a stripline as formed in accordance with the present invention is one type of communication link categorized as a transmission line.

A second, relatively small transmission line section B provides the connection between resistor 14 and a first side (for example, n-side) of laser 12. Second section B is formed by the combination of metal layer 26, substrate 16, and second conductor 24. As mentioned above and described in more detail below, resistor 14 is positioned adjacent to laser 12 so as to minimize the effect, in terms of impedance mismatch introduced by inductive parasitic elements, between resistor 14 and laser 12 by minimizing the length of transmission line section B. A metallized via 20 is utilized in conjunction with a metal contact 22 to provide the electrical connection between the top layer (p-side, for example) of laser 12 and second conductor 24. An advantage associated with using metallized via 20 to provide the electrical connection to laser 12 is that the stripline transmission quality of the input signal applied to laser 12 is maintained. In fact, by wirebonding the top side of laser 12 to metal contact layer 22, it can be imagined that the stripline formed by sections A and B as described above actually wraps around laser 12 to connection the top of laser 12 to second conductor 24. Additionally, the use of the conductive via further decreases the parasitic inductance of the connection to the top side of laser 12, by providing a bonding pad site (metal conductor 22) on the top side of substrate 16, rather than requiring the formation of a relatively long wirebond connection all the way from the top side of laser 12 to second conductor 24.

As is well-known, the physical dimensions t and w are controlled to provide the desired stripline impedance $Z_s$ for a substrate 16 of known permeability $\mu$ and permittivity $\epsilon$. For example, for a desired impedance $Z_S = 25\Omega$, with $\epsilon = 12$ and $\mu = 1$, a silicon thickness t of 0.010 inches, and a first conductor width w of 0.030 inches are appropriate.

Figure 2:
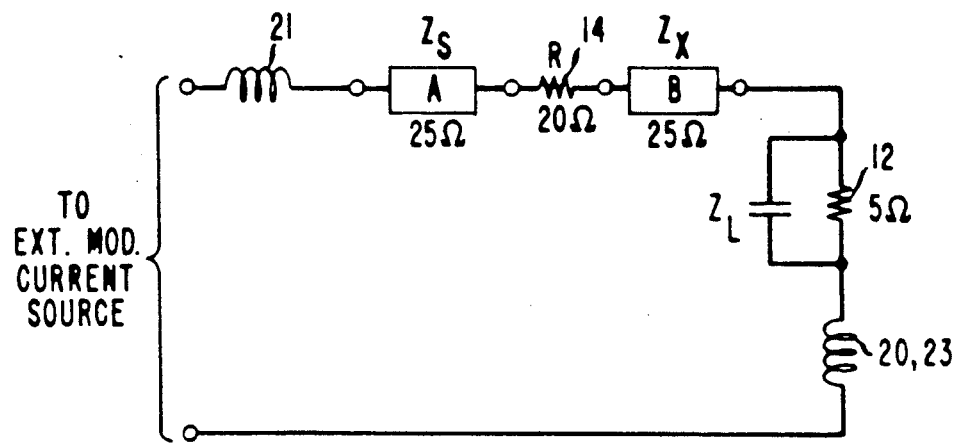
FIG. 2 is an electrical circuit equivalent of the stripline of FIG. 1.

An equivalent circuit representation of mount 10 is illustrated in FIG. 2. As discussed above, utilizing the stripline to provide direct impedance matching from laser 12 ($Z_L = \approx 5\Omega$) to the external modulating current source ($Z_E >> 50\Omega$) over a wide bandwidth (for example, from a few kHz to several GHz) is virtually impossible. Accordingly, a viable compromise is to utilize a stripline with a characteristic impedance $Z_S$ in the range between these two extremes, i.e., $Z_L < Z_S < Z_E$, while insuring that $Z_L + R = Z_S$ with minimum parasitics. A typical value for $Z_S$, as illustrated in FIG. 2, is $25\Omega$. Since the external modulating current source impedance cannot be matched to the stripline, it is essential that the stripline and laser be matched as closely as possible to avoid the multiple signal reflections and resulting waveform distortions described above. Referring to FIG. 2, laser 12 is illustrated as having an impedance $Z_L$ of $5\Omega$ (typical value). Therefore, to provide impedance matching to the stripline, resistor 14 is sized to have an impedance $R = 20\Omega$. In practice, trimming may be used to size resistor 14. The series combination of $R + Z_L$ thus provides an impedance of $25\Omega$, matching the characteristic impedance $Z_S$ of stripline section A.

An exemplary fabrication process of forming a silicon-based stripline laser mount will be described below in association with FIGS. 3-11. It is to be understood that this process is exemplary only and there exist various other techniques of creating the stripline mount structure depicted in FIG. 1. Further, although only one such mount is illustrated in the following figures, thousands of such mounts are actually being fabricated simultaneously on a single silicon wafer.

Figure 3:
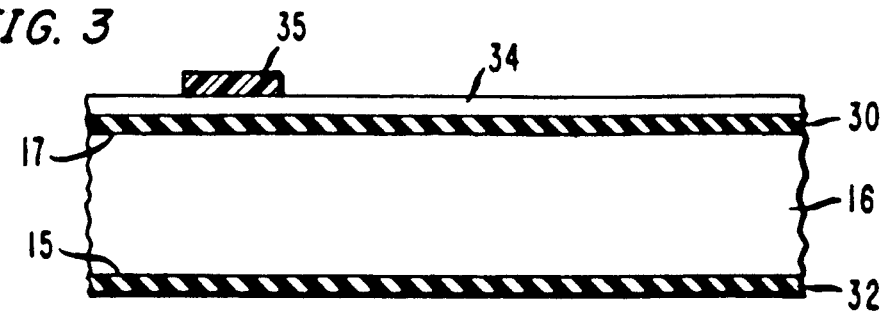
FIGS. 3-11 illustrate a series of exemplary fabrication steps which may be used to form the silicon-based stripline laser mount of the present invention.

Mount 10, in an early stage in its fabrication process, is illustrated in FIG. 3. A (100) silicon substrate 16 is formed so as to have a <110> orientation as a lithographic reference, so as to aid in later steps in the fabrication process. A relatively thick oxide layer 30 is grown (or deposited) on top surface 17 of substrate 16. Similarly, a thick oxide layer 32 is formed on bottom surface 15 of substrate 16. Oxide layers 30 and 32 may be formed simultaneously. A layer 34 of resistive material, tantalum nitride, for example, is next deposited to cover oxide layer 30. Layer 34 may be deposited utilizing plasma-enhanced chemical vapor deposition (PECVD) techniques to comprise a thickness of approximately 600Å. The thickness of layer 34 is related to the relative range of resistivities required to perform impedance matching of the laser to the stripline, where $Ta_2N$ is known to comprise a resistivity of 64Ω/□. A photoresist layer 35 is next deposited on resistance layer 34 so as to delineate the final position of the thin film matching resistor.

Figure 4:
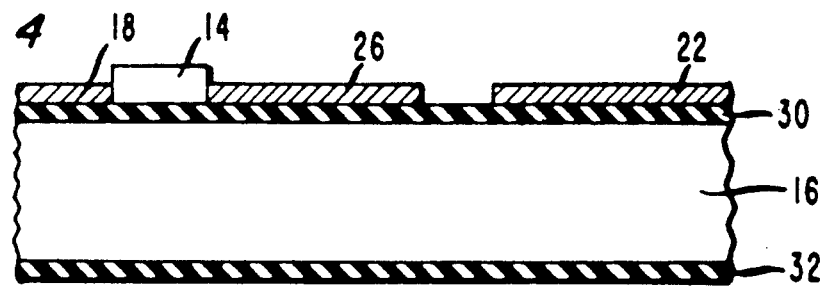

The structure of FIG. 3 is then illuminated and the exposed portions of resistance layer 34 are removed. Photoresist 35 is subsequently removed to uncover impedance matching resistor 14, as illustrated in FIG. 4. Metallic conductor areas 18, 26 and 22 are next formed, where these areas may consist of tri-level structures of titanium, titanium nitride, and platinum; the titanium nitride being a relatively thin layer which is used to prevent the formation of the compound TiPt. The compound TiPt is resistant to etching and has been found to be problematic during subsequent operations. A layer of gold may then be deposited as the top layer of metal areas 18, 26 and 22, where a thicker layer of gold is usually formed on areas 18 and 22 which will serve as wirebond pad sites. In particular, area 18, also referred to as first conductor 18, is used as a wirebond connection site between the external modulation current source (not shown) and section A of the transmission line. Metal area 26 defines the location of laser 12 and provides the bottom side (e.g., n-side) contact to laser 12. The connection to the top side of laser 12 (e.g., p-side) is provided by a wirebond between the top of laser 12 and metal contact 22, where metal contact 22 is coupled through metalized via 20 to the bottom conductive layer 24 of mount 10 (see FIG. 1). It is to be noted that any of the wirebond connections mentioned in the present context may actually consist of a number of parallel wirebonds or ribbon bonds. By using multiple bonds, the parasitic inductance of each separate bond, added in parallel, results in further reducing the overall parasitic inductance, another important means for reducing the parasitic inductance of the interconnection network. This technique is applicable to all of the illustrated wirebonds.

Figure 5:
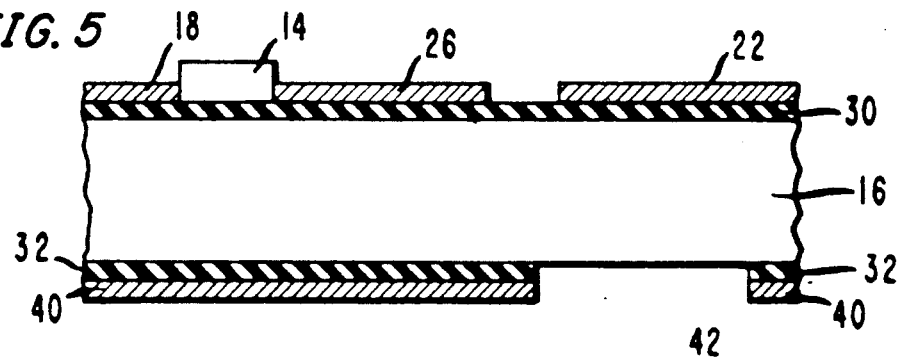
Figure 6:
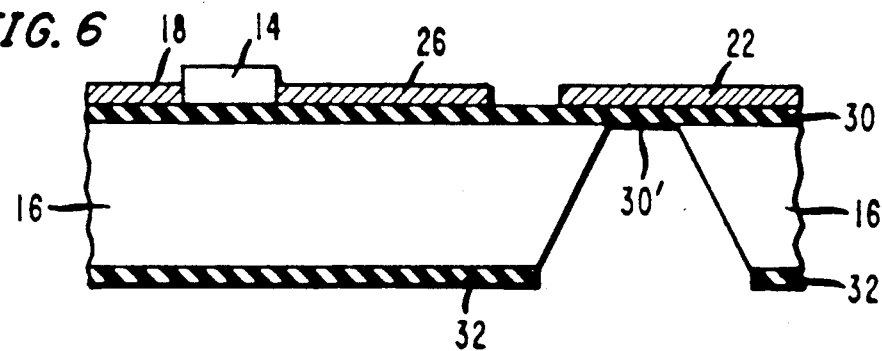
Figure 7:
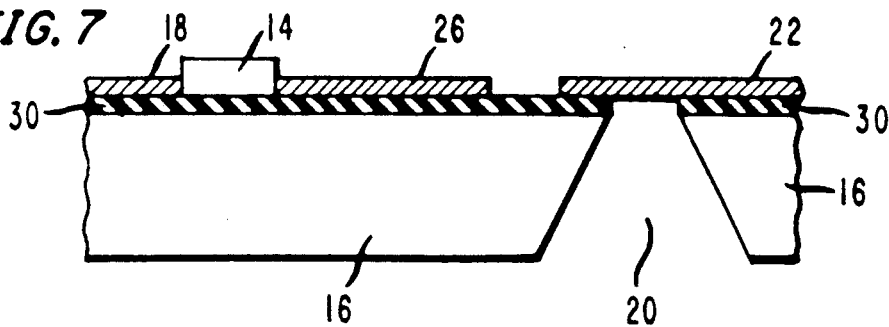

An exemplary process of forming metallized via 20 will now be described. A layer of photoresist 40 is deposited to cover oxide layer 32, with an opening 42 defining the location of via 20, as illustrated in FIG. 5. The portion of oxide 32 exposed by photoresist 40 is subsequently removed with an appropriate etch. The exposed surface of silicon substrate 16 is then etched with a substance which, by virtue of the (100) plane of the substrate, will form an inverted V-groove structure as illustrated in FIG. 6. That is, the etching substance will cause the substrate to etch along the <100> axis faster than the <111> axis, resulting in a pyramid structure bound by (111) planes. The etchant ethylenediamine pyrocatechol (EDP) is one known compound which will form this inverted V-groove structure. Silicon dioxide layer 30 acts as an etch stop for this process. Once the substrate has been etched, portion 30' of oxide layer 30 exposed by via 20, as well as oxide layer 32, are removed by an appropriate etch. The removal of portion 30' of oxide layer 30 thus exposes metal contact area 22 to via 20, as shown in FIG. 7.

Figure 8:
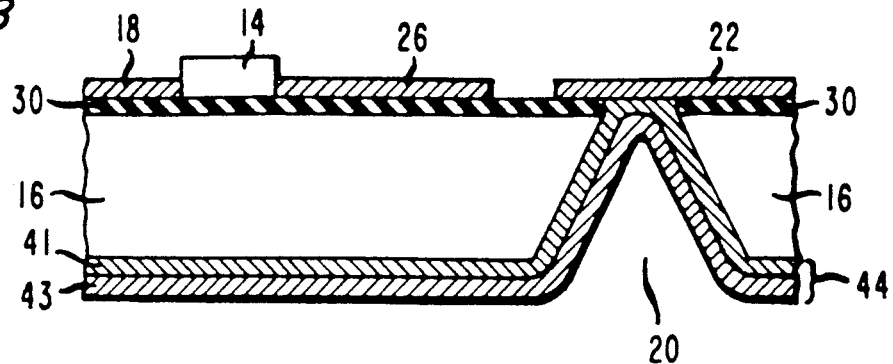

The next step in the fabrication process is to form the metallized inner walls on via 20. For the particular process to be described, the metallization is accomplished in two separate process sequences. In the first sequence, a metal contact 44 is formed to cover the exposed bottom surface 15 of substrate 16, as well as covering the exposed sidewalls of via 20. For example, metal contact 44 may consist of a first layer of titanium 41 and a second layer of platinum 43, each layer being sequentially sputtered onto the bottom surface of the structure, as illustrated in FIG. 8. In this case, no intermediate layer of titanium nitride is required, since this combination of layers will require no further etching. As shown in FIG. 8, metal contact 44 is disposed to cover the inner walls of via 20 such that a portion of contact 44 (in this case, a portion of titanium layer 41) comes into direct contact with metal contact 22. This meeting of the two layers is extremely important, since the electrical coupling of layers 44 and 22 is required to provide the electrical connection to the top side of laser 12. It is to be noted that in the preferred arrangement, the bottom-most layer of metal contact 22 is also formed of titanium.

Figure 9:
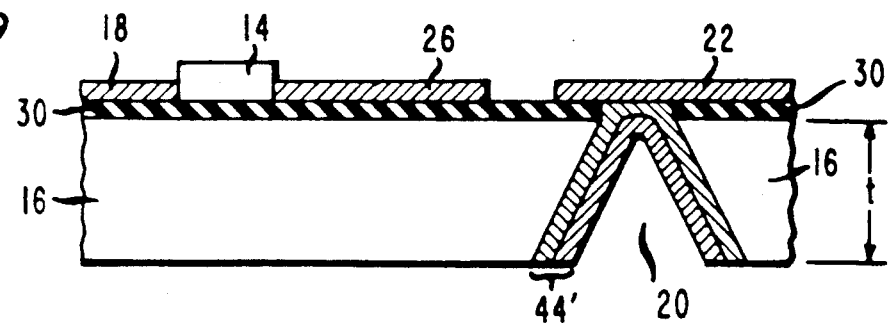
Figure 10:
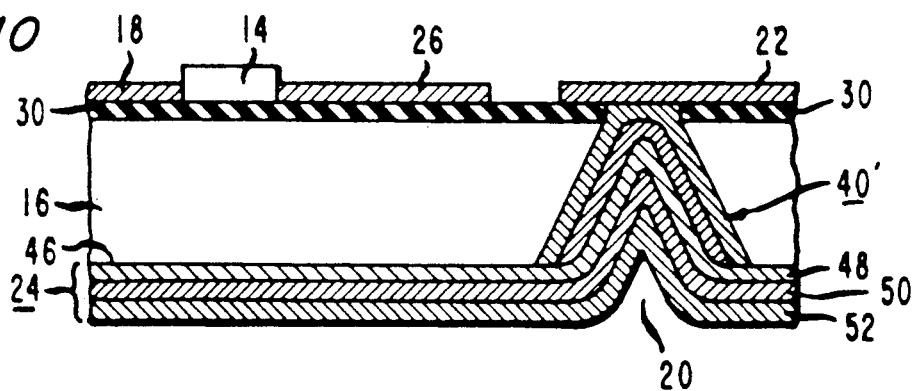

Subsequent to this metallization, a grinding (or polishing) operation is performed to reduce the overall thickness of substrate 16 (in actuality, the measured thickness defines the complete dielectric thickness of substrate 16 and overlying oxide layer 30). As discussed above, a thickness t of approximately 0.010 inches (±0.0001) is preferred and provides a stripline with an impedance of approximately 25Ω. However, if the substrate were initially formed to comprise this thickness, it would be too fragile to withstand many of the steps in the fabrication sequence as outlined above. Thus, substrate 16 is initially formed to comprise the conventional wafer thickness of 0.020 inches, where all of the fabrication steps are performed on a wafer of this thickness. Once via 20 has been metallized, the substrate may be thinned to the appropriate value. FIG. 9 illustrates mount 10 subsequent to this thinning operation. As shown, the horizontal portions of metal contact 44 will be completely removed, but the walls of via 20 remain metalized, as denoted 44' in FIG. 9.

Subsequent to the thinning operation, the exposed bottom surface 46 of substrate 16 is then metallized to form conductor 24 of mount 10. In one particular arrangement, conductor 24 may consist of a tri-level structure including a first layer 48 of titanium, a second layer 50 of platinum and a third layer 52 of gold. If these layers are deposited by a conventional sputtering technique, layers 48, 50 and 52 will cover not only exposed bottom surface 46, but will also fill in, to some extent, via 20.

Figure 11:
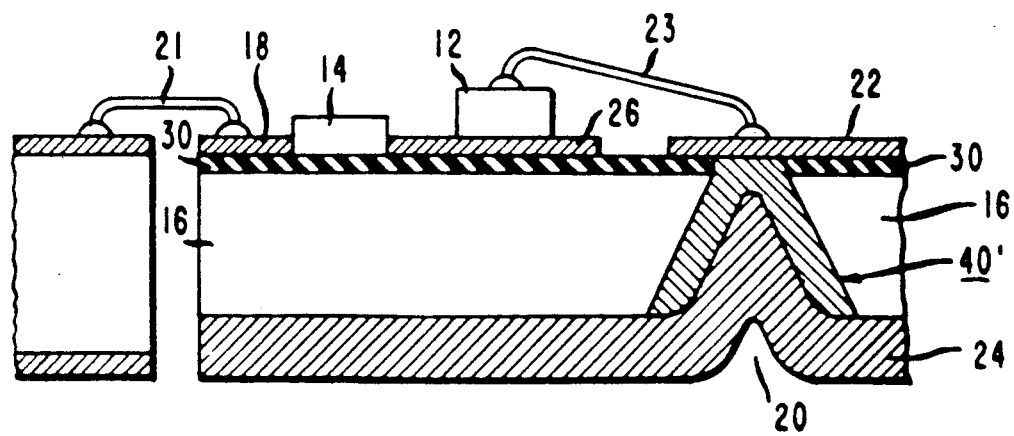

Once this metallization has been completed, the wafer may be diced to separate the thousands of mounts so formed. The individual laser chips 12 are then mounted on metal contact 26 and the necessary wirebond connections are formed, as shown in FIG. 11.

What is claimed is:

1. A method of forming a silicon-based stripline for providing an interconnection between a semiconductor optical device and a high frequency modulation signal source, said method comprising the steps of:
   (a) providing a silicon substrate including first and second opposing major surfaces;
   (b) depositing a thin film resistor on said first major surface of said substrate;
   (c) forming a via through said silicon substrate at a spaced-apart location from said thin film resistor and;

(d) metallizing longitudinal portions of said first and second major surfaces of said substrate, as well as the via, the first longitudinal portion being of a predetermined width w, the combination of said first and second metallized longitudinal portions with said substrate thus forming a stripline transmission path with a characteristic impedance $Z_s$, and the via being utilized to provide electrical connection between the second metallization and the semiconductor device.

2. The method according to claim 1 wherein in performing step (b), tantalum nitride is deposited as the thin film resistor.

3. The method according to claim 2 wherein in performing step (b), a plasma-enhanced chemical vapor deposition technique is utilized.

4. The method according to claim 1 wherein in performing step (a), a (100) silicon substrate with a <110> lithographic orientation is provided.

5. The method according to claim 4 wherein in performing step (c), the etchant ethylenediamine pyrocatechol (EDP) is utilized to form an inverted V-shaped via with respect to the first major surface of the substrate.

6. The method according to claim 1 wherein in performing step (d), the metallizations comprises a tri-level metallization of titanium, platinum and gold, deposited sequentially on said substrate.

7. The method according to claim 1 wherein in performing step (d), a sputtering operation is used to deposit the metallizations.

* * * * *